United States Patent [19]

Lim et al.

[11] Patent Number: 5,247,299
[45] Date of Patent: Sep. 21, 1993

[54] SUCCESSIVE APPROXIMATION A/D CONVERTER CORRECTING FOR CHARGE INJECTION OFFSET

[75] Inventors: Peter N. C. Lim, Normanton Park, Singapore; Larry S. Metz, Fort Collins, Colo.

[73] Assignee: Hewlett-Packard Company, Palo Alto, Calif.

[21] Appl. No.: 892,103

[22] Filed: Jun. 2, 1992

[51] Int. Cl.[5] .......................................... H03M 1/38
[52] U.S. Cl. .................................. 341/136; 341/165
[58] Field of Search ............... 341/163, 164, 165, 136

[56] References Cited

U.S. PATENT DOCUMENTS

| | | | |
|---|---|---|---|
| 3,818,246 | 6/1974 | Hellwarth et al. | 307/251 |
| 4,228,423 | 10/1980 | Schwerdt | 341/118 |
| 4,947,169 | 8/1990 | Smith et al. | 341/121 |
| 4,973,975 | 11/1990 | Yamazaki et al. | 341/122 |

OTHER PUBLICATIONS

A. Grebene, Bipolar and MOS Analog Integrated Circuit Design (John Wiley & Sons, Inc., 1984), Chapter 15.

Primary Examiner—Marc S. Hoff

[57] ABSTRACT

In a successive-approximation analog-to-digital conversion application, charge injection offset at the sample input of the comparator resulting from the changing DAC reference voltage, is converted to a fixed, systematic offset. In the comparator differential input stage, the reference or driven input device is turned off during a sample time, prior to beginning the conversion process, so that substantially all of a predetermined bias current flows in the sample side of the comparator. Given this initial condition, the change in input voltage through conversion is a fixed function of the device geometry, bias current and gain, independent of the sample voltage, and therefore may be calibrated out of the system. The comparator input stage includes a differential pair of MOS transistors. A CMOS transmission gate is coupled between the DAC output and the reference comparator input. A switch transistor is coupled between the reference input, i.e. the gate of M2, and Vdd for biasing off M2 during sample time. Transmission gate and switch transistor are controlled by a binary control signal "sample/convert" to turn M2 off during a sample time, and to couple the DAC output to the reference input during convert time.

10 Claims, 2 Drawing Sheets

SUCCESSIVE APPROXIMATION A/D CONVERTER CORRECTING FOR CHARGE INJECTION OFFSET

FIELD OF THE INVENTION

The invention relates to the field of integrated circuit successive-approximation analog-to-digital converters (SA-ADC) and more particularly, to methods and apparatus for controlling or eliminating charge injection effect in the input stage comparator in a successive-approximation ADC circuit.

BACKGROUND OF THE INVENTION

A successive-approximation converter is a feedback system which operates on a trial-and-error technique to approximate an analog input with a corresponding digital code. The system is comprised of a so-called successive approximation register (SAR) and a D/A converter in feedback around a voltage comparator.

In general, with reference to FIG. 1, an SA-ADC converter operates as follows. Prior to the start of the conversion process, an N-bit sequencer or shift register and an N-bit holding register which form the successive-approximation register section are cleared. In the first step of conversion, a "1" is inserted as a trial bit for the MSB in the holding register, with the rest of the bits remaining at "0". If the resulting analog output of the D/A converter Vref is less than or equal to the Vin, the output state of the comparator remains unchanged and the "1" is retained for the MSB; otherwise it is replaced by a "0".

Then, in the next cycle, a "1" is tried for the second significant bit. If the comparator output does not change state, it is retained; otherwise it is replaced by a "0". In this manner, the approximation process is repeated until all bits are calculated in N successive cycles. A general description of the prior art appears in A. Grebene, Bipolar and MOS Analog Integrated Circuit Design (John Wiley & Sons, Inc., 1984), chapter 15.

In a sampled ADC circuit, a sample step is conducted prior to beginning the actual conversion. During sampling, an input voltage or "sample voltage" is stored on a sample capacitor. The capacitor is coupled to one side of a differential pair of transistors forming the comparator input stage. A bias current source provides a predetermined bias current Io to the comparator input stage differential pair of transistors (M1, M2). A typical comparator input stage schematic is shown in FIG. 2.

Referring now to FIG. 2, the driven input voltage, or reference voltage Vref, is applied to the gate of M2 (REF). Vref is provided by a DAC converter (not shown) disposed in a feedback loop from the comparator (see FIG. 1). The reference voltage typically has a fast rise time. As a result, parasitic gate capacitances of M1 and M2, labeled Cgs1 and Cgs2, respectively, couple the changing Vref through M2 to the common drain node V1, and thence through M1 back to the sample input node Vin. This charge injection current results in a change in the charge on C, and hence a change in the sample voltage Vin. Thus, $$\Delta Vref \to \Delta Q \text{ where Q is the charge on C, and} \quad [1]$$

$$\Delta Q \to \Delta Vin = \Delta Q/C \quad [2]$$

The resulting change in Vin, an input offset source of error, is a function of the difference between Vref and Vin when the sample is taken. The error can be large, because the reference voltage can swing over the entire common mode range, for example, 10 volts.

To illustrate, assume Vin = +10 and Vref = 0 at sample time. At this time, the common source node is roughly a threshold voltage above Vref. At the end of conversion Vref = Vin' where Vin' = Vin + $\Delta$V1 Cgs1/C, the error term being due to the change in V1 with respect to Vin.

If we approximate $\Delta$V1 $\approx$ Vin $-$ 10 V, the error term Vin-Vin' $\approx$ (Vin $-$ 10 V). Cgs1/C. Typical values of Cgs1 and C are 100 ffd and 10 pfd respectively, generating offset voltages up to around 100 mV for a 10 analog input range. It is difficult to compensate for the injected current offset because it depends upon the sample voltage Vin. What is needed is a sampled ADC that does not suffer inaccuracies resulting from charge injection.

SUMMARY OF THE INVENTION

An object of the present invention is to convert charge injection offset to a systematic, fixed offset that is substantially independent of the sampled (input) voltage.

Another object is to allow correction of charge injection offset through system calibration.

A further object of the invention is to address the charge injection problem through a method that is simple and easy to implement in a standard process integrated circuit.

The present invention is based upon the realization that, at the *end* of the successive approximation conversion, the voltages at both inputs to the comparator, i.e. Vin and Vref in FIG. 2, will be approximately equal (within ½ LSB of the DAC output voltage). At that time, the current flowing down each input stage branch, i.e. in the sources of M1 and M2, equals approximately Io/2 i.e. one-half the bias current.

If the driven input or reference node, Vref is coupled to the supply rail Vdd, or otherwise turned OFF while the sample voltage is being sampled, in other words before the conversion actually begins, no current flows in M2, so the initial current in the M1 branch equals the bias current Io. Hence, through the whole successive approximation process, the net change of current in M1, $\Delta$I is $-$Io/2. Assuming that there is no diode action so that there is conservation of charge, then the charge injection effect in this whole process would have injected a net charge of $\Delta Q = Cgs1 \cdot \Delta Vgs$ on the sample capacitor C.

$$\Delta Vgs = \Delta I/gm = -Io/(2\ gm), \text{ where} \quad [3]$$

gm is approximately given by the formula:

$$(Vgs - Vt) \cdot k' \cdot (W/L) \quad [4]$$

Note that V1 (the common drain node) $\approx$ Vin + Vt, which implies that:

$$Vgs = Vin - V1 = -Vt. \quad [5]$$

$$\text{Hence, } gm = (-2Vt) \cdot k' \cdot (W/L) \quad [6]$$

which is not dependent on the value of Vin. Therefore, $\Delta Vin = \Delta Q/C$ also is independent of Vin. A charge injection error that is independent of the sample voltage can easily be calibrated out of the system or otherwise corrected.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
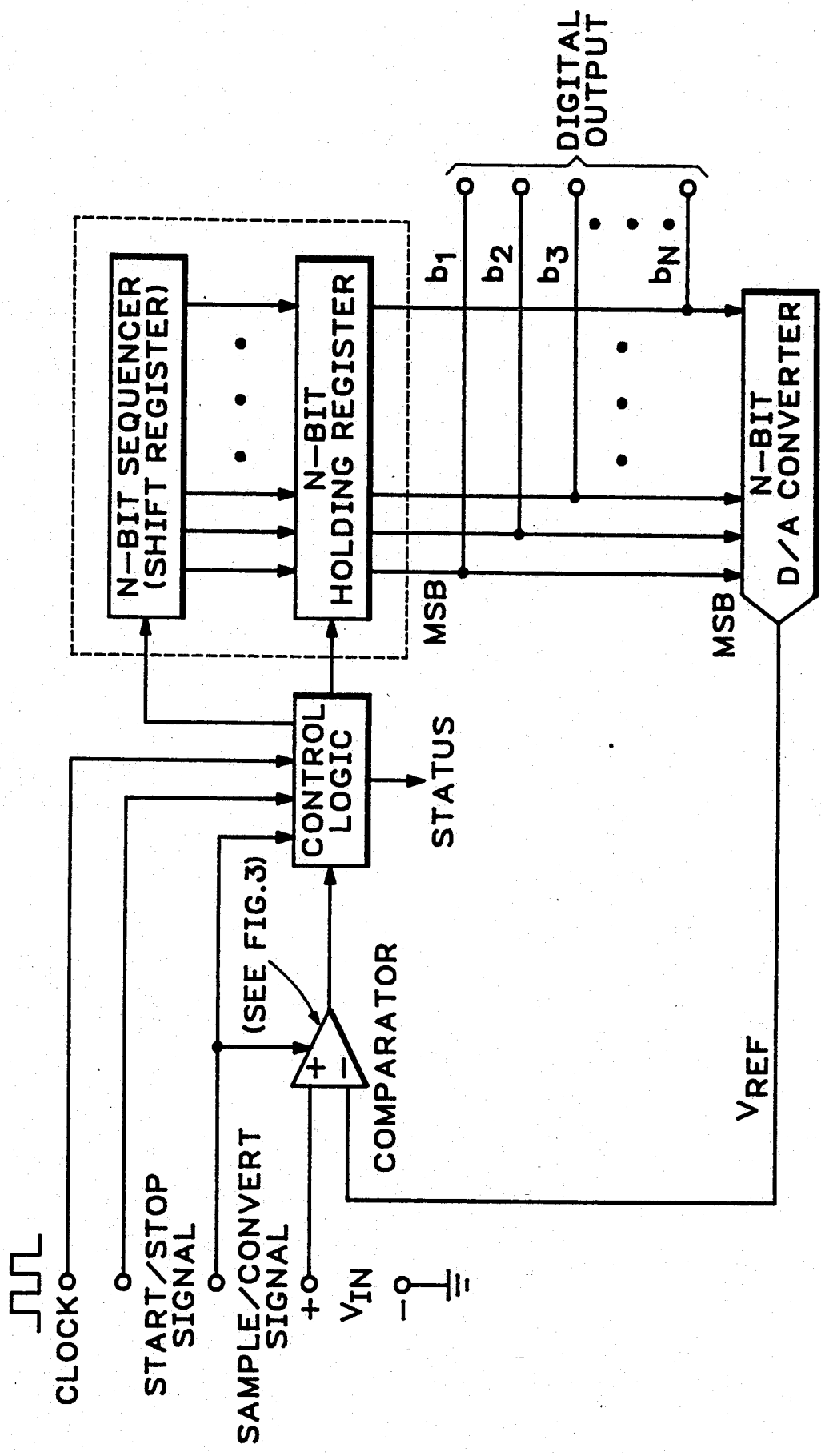
FIG. 1 is a functional block diagram of a successive-approximation A/D converter according to the present invention.

One aspect of the present invention is a method of correcting for charge-injection sample voltage offset comprising the steps summarized below. This method assumes a comparator having a predetermined device geometry including an input stage comprising a differential pair of transistors coupled to a bias current source, one of the pair of transistors having a control or gate terminal defining a sample input terminal, and the other (second) transistor having a control terminal coupled to receive a reference voltage.

The new method includes providing a capacitor coupled to the sample input terminal; storing a sample voltage on the capacitor; and controlling the bias current source so as to provide a predetermined bias current to the input transistors. Next, the reference side (second) input transistor is turned OFF so that substantially all of the bias current initially flows in the sample side (first) transistor. After substantially all of the bias current is flowing in the first transistor, the conversion proceeds, as in the prior art, to convert the sample voltage by successively changing the reference voltage, responsive to a comparison of the sample voltage to the reference voltage, until the reference voltage is approximately equal to the sample voltage.

As a result of the foregoing, the net charge injection during the entire process, i.e. from the initial sampling, when the second transistor is OFF, through the conversion process, is a substantially fixed, systematic offset. See equations [3]–[6] above. The new offset is a constant function of the comparator geometry and independent of the sample voltage. It is, therefore, possible to correct for the induced sample voltage offset.

Another aspect of the invention is a comparator for successive approximation ADC conversion comprising the following: A differential pair of transistors, each having an input terminal and a control terminal; and means for providing a predetermined bias current, coupled between the power supply rail and the input terminals of the pair of transistors. Thus, a first one of the transistor control terminals defines a sample input node, and the other transistor control terminal defines a reference input node. A capacitor is coupled to the sample input node so that a voltage stored on the capacitor defines a sample voltage. A conventional DAC provides a succession of reference voltages for comparison to the sample input voltage during conversion.

A new binary control signal "sample/convert" indicates, by a first or "sample state", during which time the sample voltage is stored on the capacitor. The binary input signal changes state at the time the conversion begins. This binary input signal is used to turn OFF the second input transistor during sample time, and to couple the DAC to the reference input of the comparator responsive to the other state ("convert") of the binary input signal so as to begin conversion.

In one illustrative embodiment of the new comparator, the input differential pair include a pair of MOS transistors. A "switch means" includes an input terminal coupled to receive the binary input signal, an inverter coupled to the input terminal to provide an inverted input signal, an MOS transistor coupled between the power supply rail and the reference input node and having a gate terminal coupled to receive the inverted input signal, and a CMOS pair coupled in parallel between the DAC means and the reference input terminal.

The CMOS pair have a first gate terminal coupled to receive the input signal and a second gate terminal coupled to receive the inverted input signal. The MOS transistor and the CMOS pair are arranged so that the MOS transistor is ON and the CMOS pair are OFF responsive to the first state of the input signal, i.e. during sampling. The MOS transistor is OFF and the CMOS pair are ON responsive to the other state of the input signal, i.e. during conversion.

FIG. 1 is a block diagram of a successive-approximation A/D converter. Converters of the general type shown are known in the prior art, with the following exception. A new signal, labeled "sample/convert," is provided to the comparator and the control logic according to the present invention, for addressing the charge injection problem. The block diagram otherwise is conventional and operates as described above in the background section.

Figure 2:
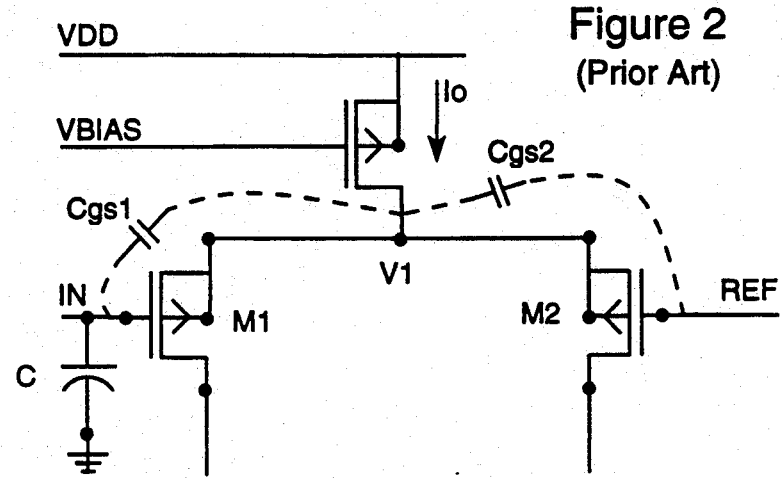
FIG. 2 is a schematic diagram of a prior art SA-ADC comparator input stage.

FIG. 2 is a schematic diagram of a known successive-approximation (SA) ADC circuit. It's operation is known in the prior art. A problem with circuits of this type is known as charge injection. In this context, charge injection is a phenomenon whereby a voltage variation is induced on a capacitor holding the voltage to be measured by the SA-ADC method. This occurs when the driven (or reference) input voltage changes (through the SA-ADC process), and charge is injected onto the capacitor through gate capacitance coupling. The greatest difficulty arises in that the amount of voltage offset is a function of the voltage being sampled, and therefore is unknown.

Figure 3:
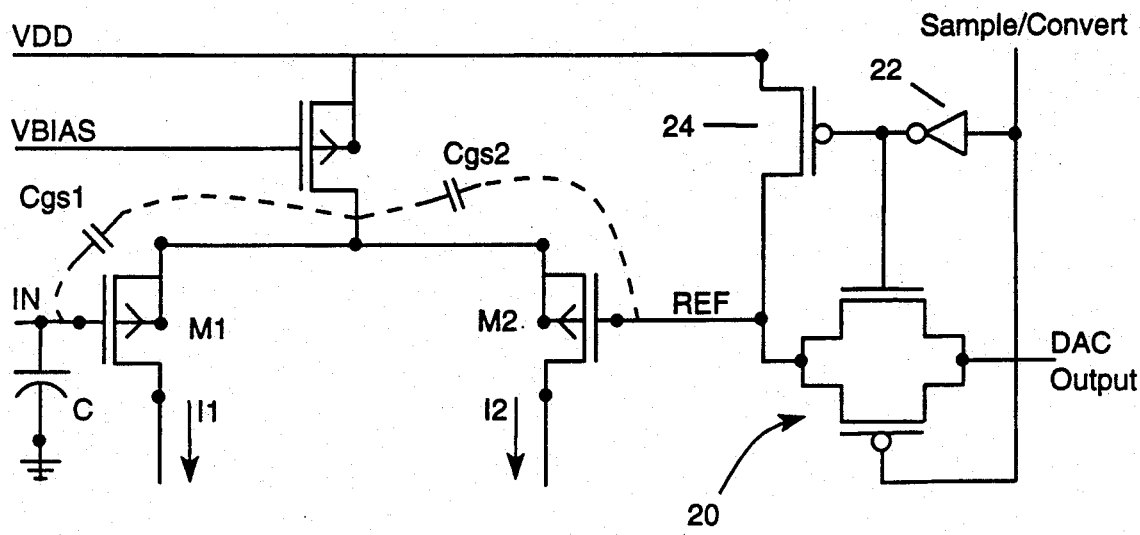
FIG. 3 is a schematic diagram of an SA-ADC comparator input stage according to the present invention.

Referring now to FIG. 3, the sample voltage offset can be corrected by converting it to a fixed, systematic offset. This is done as follows. The left part of the diagram of FIG. 3 shows the comparator input stage, comprising MOS transistors M1 and M2, and a bias transistor. The input stage operates as described above.

The DAC output signal is coupled through a transmission gate 20 to the reference input of the comparator, i.e., the gate of M2. The function of the transmission gate 20 can be provided by any suitable circuit for selectively coupling the reference voltage from the DAC to the comparator input stage or conversely, decoupling the input stage, responsive to a control signal. In the preferred embodiment, a CMOS transmission gate is convenient. The new binary signal "sample/convert" is coupled to one of the control inputs of transmission gate 20. The sample/convert signal is coupled through an inverter 22 to the other transmission gate control input terminal.

A transistor 24 is coupled between the comparator reference input and the power supply rail VDD. Transistor 24 is controlled by the sample/convert circuit. In the preferred embodiment, transistor 24 is a PMOS device having its gate terminal coupled to the output of converter of 22.

In operation, when a voltage is being sampled, the sample/convert signal is high or logical "1", which couples the comparator reference node through transistor 24 to VDD. This has the effect of turning transistor M2 off, thereby setting the branch current I2 approximately to "0" and setting the branch current I1 equal to the comparator bias current Io. Transmission gate 20 is OFF.

To begin the conversion process, sample/convert signal goes low, thereby turning on transmission gate 20 to couple to DAC voltage Vref to the comparator reference input, and turning transistor 24 off, so that the comparator reference input is driven by the DAC output voltage during the conversion process. The conversion process then proceeds normally.

At the end of the SA-ADC sequence, voltages Vin and Vref are essentially equal. In view of the circuit topology and the relationships shown above, the net change of charge at the sample node is not a function of the value of the sample voltage at the compacitor. Rather, the charge injection is converted into a fixed systematic offset which is easily removable by calibration.

In one operative example of an embodiment of the invention, it is employed in a CMOS integrated circuit having a plurality of sample and hold channels and comparators. The circuit is fabricated in a 15 volt, 5 micron-gate, single-layer poly, single-layer metal, twin well, full guard ringed CMOS process. The comparators are configured to perform 12-bit successive approximation conversion of an external voltage which is sampled prior to conversion onto an on-chip 13 pF capacitor. In this embodiment, the $\Delta VIN$ works out to be approximately 1 mV.

In general, combining the relationships given above, it appears that: $\Delta Vin = Cgs/C \cdot - Io/2gm$. For example, in the preferred embodiment described, gm is about $20 \cdot Io$, so $\Delta Vgs = 1/40$ volt or 25 mV. Therefore, $\Delta Vin$ (sample voltage) $= \Delta Q/C = Cgs/C \cdot 25$ mV = approximately 1 mV for Cgs/C of 1/25. This offset can be calibrated out of the system.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A successive-approximation ADC circuit comprising:
    a comparator input stage having a differential pair of transistors, each having an input terminal and a control terminal, a first transistor control terminal defining a sample input node and the second transistor control terminal defining a reference input node;
    means for providing a predetermined bias current to the input terminals of the pair of transistors;
    a capacitor coupled to the sample input node to provide a sample voltage;
    DAC means for providing a succession of reference voltages to the reference input node for comparison to the sample voltage during an ADC conversion;
    first switch means, coupled between the reference input node and the DAC means for decoupling the reference input node form the DAC means during a sample state preparatory to ADC conversion and for coupling the reference input node to the DAC means to receive the reference voltages during conversion; and
    second switch means coupled to the reference node for turning OFF the second transistor during the sample state so that substantially all of the bias current flows in the first transistor during the sample state.

2. A successive-approximation ADC circuit according to claim 1 wherein both the first and second switch means are controlled by a sample/convert binary control signal.

3. A successive-approximation ADC circuit according to claim 2 wherein:
    the comparator input stage differential pair comprise first and second MOS transistors and the second switch means includes:
    input means coupled to receive the binary control signal; and
    a third MOS transistor coupled between a power supply rail and the reference input node and having a gate terminal coupled to receive the binary control signal, arranged so that the third MOS transistor is ON responsive to a sample state of the binary control signal, thereby turning OFF the comparator input stage second MOS transistor so that the bias current flows in the input stage first transistor during the sample state of the binary control signal.

4. A successive-approximation ADC circuit according to claim 2 wherein:
    the comparator input stage differential pair comprise first and second MOS transistors and the first switch means includes:
    a CMOS pair of transistors coupled in parallel between the DAC means and the reference input node so as to form a transmission gate, the transmission gate having a control terminal coupled to receive the binary control signal so that the transmission gate is OFF responsive to a sample state of the binary control signal, and the transmission gate is ON responsive to the convert state of the binary control signal, thereby coupling the reference node to the DAC means for A/D conversion during the convert state of the binary control signal.

5. A successive-approximation ADC circuit comprising:
    a comparator input stage having a differential pair of MOS transistors, each having an input terminal and a control terminal, a first transistor's control terminal defining a sample input node and the second transistor's control terminal defining a reference input node;
    a third MOS transistor coupled to the input terminals of the first and second MOS transistors so as to provide a predetermined bias current;
    a capacitor coupled to the sample input node for storing a sample voltage during a sample state of the circuit;
    DAC means for providing a succession of reference voltages to the reference input node for comparison to the sample voltage;
    a CMOS switch, coupled between the reference input node and the DAC means for controllably decoupling the reference input node from the DAC means during a sample state of the circuit and for coupling the reference input node to the DAC means to receive the reference voltages during a convert state of the circuit; and means coupled to the reference input node for turning OFF the second MOS transistor during said sample state so as to establish an initial current in the first MOS transistor substantially equal to the bias current.

6. A successive-approximation ADC circuit according to claim 5 wherein:

the comparator input stage MOS transistors each have source, drain and gate terminals, the respective drain terminals defining the input terminals and the respective gate terminals defining the control terminals, the third MOS transistor being connected to the first and second transistor drain terminals to provide the bias current; and further comprising:

control means for providing a binary control signal, the binary control signal having a predetermined first state defining the sample state of the circuit and a second state defining the convert state of the circuit;

inverter means coupled to receive the binary control signal for providing an inverted control signal; and a fourth MOS transistor having a drain terminal coupled to a power supply, a gate terminal coupled to receive the inverted control signal and a source terminal coupled to the reference node, so as to bias the reference node to the power supply voltage, thereby turning the second MOS transistor OFF during the sample state of the circuit.

7. A successive-approximation ADC circuit according to claim 6 further comprising:

a complementary pair of CMOS transistors coupled together in parallel between the DAC means and the reference input node, the gates of the CMOS pair being coupled to receive the binary control signal and its complement, respectively, so as to couple the DAC means to the reference input node during the convert state of the circuit.

8. In a successive-approximation ADC circuit having a comparator input stage comprising a differential pair of transistors coupled to a bias current source, a first one of the pair of transistors having a control terminal coupled to a capacitor to receive a sample voltage, and the second transistor having a control terminal coupled to receive a series of reference voltages, a method of ADC conversion comprising the steps of:

storing a sample voltage on the capacitor;

controlling the bias current source so as to provide a predetermined bias current to the pair of transistors;

after said storing and controlling steps, and prior to commencing an ADC conversion process, turning OFF the second transistor so that substantially all of the bias current initially flows in the first transistor; and then, coupling the second transistor control terminal to receive a first one of the series of reference voltage so as to begin the ADC conversion process;

whereby a sample voltage offset resulting from net charge injection during the conversion process is a substantially constant function of the comparator geometry and, therefore, independent of the sample voltage.

9. A method according to claim 8 further comprising:

providing a binary control signal having a sample state and a convert state;

setting the control signal to the sample state during said storing step; and then setting the control signal to the convert state to begin the ADC conversion; and wherein:

said turning OFF the second transistor is responsive to the sample state of the control signal; and said coupling step is responsive to the convert state of the control signal.

10. A method according to claim 9 further comprising:

determining a charge injection offset voltage $\Delta V_{in}$ according to the formula $\Delta V_{in} = C_{gs}/C \cdot - I_o/2 g_m$, where $C_{gs}$ is the comparator input stage parasitic gate capacitance, C is the sample capacitance, $I_o$ is the bias current, and $g_m$ is the device gain; and calibrating the ADC to correct for the determined offset voltage.

* * * * *